(12) United States Patent
Yang et al.

(10) Patent No.: US 12,047,058 B2
(45) Date of Patent: Jul. 23, 2024

(54) IGBT DRIVING CIRCUIT AND POWER CONVERSION DEVICE

(71) Applicant: Gree Electric Appliances, Inc. of Zhuhai, Guangdong (CN)

(72) Inventors: Bo Yang, Guangdong (CN); Meng Huang, Guangdong (CN); Jing Wang, Guangdong (CN); Xianqiao Yu, Guangdong (CN); Shan Zhang, Guangdong (CN); Mingzhao Fang, Guangdong (CN)

(73) Assignee: Gree Electric Appliances, Inc. of Zhuhai, Guangdong (CN)

( * ) Notice: Subject to any disclaimer, the term of this patent is extended or adjusted under 35 U.S.C. 154(b) by 16 days.

(21) Appl. No.: 18/016,392

(22) PCT Filed: Jul. 23, 2021

(86) PCT No.: PCT/CN2021/108136
§ 371 (c)(1),
(2) Date: Jan. 16, 2023

(87) PCT Pub. No.: WO2022/121324
PCT Pub. Date: Jun. 16, 2022

(65) Prior Publication Data
US 2023/0299763 A1     Sep. 21, 2023

(30) Foreign Application Priority Data
Dec. 7, 2020  (CN) .................. 202011416862.4

(51) Int. Cl.
*H03K 17/0812* (2006.01)
*H02M 1/08* (2006.01)

(52) U.S. Cl.
CPC ........ *H03K 17/08128* (2013.01); *H02M 1/08* (2013.01); *H03K 2217/0027* (2013.01)

(58) Field of Classification Search
CPC ............................................. H03K 17/08128
(Continued)

(56) References Cited

U.S. PATENT DOCUMENTS

| 5,986,484 A | 11/1999 | Kimata |
| 6,906,574 B2 | 6/2005 | Ohi et al. |
| 2017/0179944 A1 | 6/2017 | Ngo et al. |

FOREIGN PATENT DOCUMENTS

| CN | 102231594 A | * | 11/2011 |
| EP | 0817381 B1 | | 4/2004 |
| WO | 2020158853 A1 | | 8/2020 |

* cited by examiner

*Primary Examiner* — Tomi Skibinski
(74) *Attorney, Agent, or Firm* — The Webb Law Firm

(57) ABSTRACT

The present disclosure relates to an IGBT driving circuit and a power conversion device. The IGBT driving circuit includes a driving chip with a first driving signal port (Vo); a driving resistor adjustment circuit connected between the first driving signal port (Vo) and a gate (G) of an IGBT, a driving resistor formed by the driving resistor adjustment circuit being adjustable in size; a peak voltage detection circuit connected to the gate (G) of the IGBT which is conductive to the first driving signal port (Vo), the peak voltage detection circuit being configured to monitor whether a peak voltage occurs when the IGBT is turned off; and a resistor adjustment control circuit connected between the peak voltage detection circuit and the driving resistor adjustment circuit and configured to reduce a resistor formed by the driving resistor adjustment circuit when the peak voltage is monitored when the IGBT is turned off.

9 Claims, 1 Drawing Sheet

(58) Field of Classification Search
USPC .................................................. 327/108–112
See application file for complete search history.

IGBT DRIVING CIRCUIT AND POWER CONVERSION DEVICE

CROSS-REFERENCE TO RELATED APPLICATIONS

The present application is a U.S. National Phase Application of International Patent Application No PCT/CN2021/108136, filed Jul. 23, 2021, and claims priority to Chinese Patent Application No. 202011416862.4, filed Dec. 7, 2020, the disclosures of which are hereby incorporated by reference in their entireties.

BACKGROUND OF THE INVENTION

Field of the Invention

The present disclosure relates to the field of power device technologies, in particular to an IGBT driving circuit and a power conversion device.

Description of Related Art

In a power conversion device, an Insulated Gate Bipolar Transistor (IGBT) is one of core devices, and decides whether power conversion is performed normally or not. However, in a turn-off process of the IGBT, a gate is often affected by other parasitic capacitances and stray inductances to accumulate charge and form a peak voltage, leading to the risk of electrical conduction by mistake. That is, if the peak voltage exceeds a turn-on voltage threshold of the IGBT, the IGBT will be electrically conducted during a turn-off period, and will be electrically conducted with other IGBTs working in the same bridge arm simultaneously, resulting in short circuit and damages to the IGBT.

Therefore, in order to ensure normal operation of the IGBT, the key is to suppress the peak voltage of the gate and eradicate the problem of electrical conduction by mistake.

SUMMARY OF THE INVENTION

According to a first aspect of the present disclosure, there is provided an IGBT driving circuit, including:
- a driving chip having a first driving signal port;
- a driving resistor adjustment circuit, connected between the first driving signal port and a gate of an IGBT, a driving resistor formed by the driving resistor adjustment circuit being adjustable;
- a peak voltage detection circuit, connected to the gate of the IGBT which is conductive to the first driving signal port, the peak voltage detection circuit being configured to monitor whether a peak voltage occurs when the IGBT is turned off; and
- a resistor adjustment control circuit, connected between the peak voltage detection circuit and the driving resistor adjustment circuit, and configured to reduce a resistor formed by the driving resistor adjustment circuit when the peak voltage is monitored when the IGBT is turned off.

In some embodiments, the driving resistor adjustment circuit includes a first driving resistor, a first MOS transistor, a second driving resistor and a third anti-reverse diode;
wherein a first terminal of the first driving resistor is conductive to the first driving signal port, a second terminal of the first driving resistor is conductive to the gate of the IGBT, and the first MOS transistor, the second driving resistor and the third anti-reverse diode are connected in series and then connected to the first driving resistor in parallel.

In some embodiments, the driving chip has a forward bias voltage output port, and a first gate of the first MOS transistor is connected to the forward bias voltage output port and the resistor adjustment control circuit;
wherein the resistor adjustment control circuit is configured to ground and turn off the first gate of the first MOS transistor when a voltage is normal after the IGBT is turned off, so that the driving resistor is the first driving resistor; when the peak voltage is monitored, the voltage at a connection position between the first gate of the first MOS transistor and the resistor adjustment control circuit is lower than the voltage of the forward bias voltage output port, so that the first MOS transistor is turned on and the driving resistor is a resistor formed by connecting the first driving resistor and the second driving resistor in parallel.

In some embodiments, the driving chip has the forward bias voltage output port, and the first gate of the first MOS transistor is connected to the forward bias voltage output port through a first protection resistor.

In some embodiments, the peak voltage detection circuit includes a PNP-type triode, a breakdown diode, a first anti-reverse diode, a second protection resistor and a third protection resistor;
wherein the breakdown diode, the first anti-reverse diode and the second protection resistor are sequentially connected in series, the second protection resistor is connected to the resistor adjustment control circuit, an emitter of the PNP-type triode is connected to the breakdown diode, a collector of the PNP-type triode is directly connected to the gate of the IGBT, and a base of the PNP-type triode is connected to the gate of the IGBT through the third protection resistor.

In some embodiments, the driving chip has a second driving signal port which is conductive to an emitter of the IGBT, and a connection position between the peak voltage detection circuit and the resistor adjustment control circuit is connected to the second driving signal port through a fourth protection resistor.

In some embodiments, the driving chip has the second driving signal port which is conductive to an emitter of the IGBT, and the resistor adjustment control circuit includes:
- a second anti-reverse diode and a freewheel capacitor connected in series, wherein an anode of the second anti-reverse diode is connected to a circuit where the first driving signal port is connected to the gate of the IGBT, a connection point is located between the driving resistor adjustment circuit and the peak voltage detection circuit, and one terminal of the freewheel capacitor is connected to the second driving signal port;
- a second MOS transistor, wherein a second source of the second MOS transistor is connected to the driving resistor adjustment circuit, a second drain of the second MOS transistor is connected to the second driving signal port, and a second gate of the second MOS transistor is connected between the second anti-reverse diode and the freewheel capacitor; and
- an NPN-type triode, wherein a collector of the NPN-type triode is connected to the second gate, an emitter of the NPN-type triode is connected to the second driving signal port, and a base of the NPN-type triode is connected to one terminal of the peak voltage detection circuit connected to the emitter of the IGBT.

In some embodiments, the driving resistor adjustment circuit includes the first driving resistor, the first MOS transistor, the second driving resistor and the third anti-reverse diode; the first terminal of the first driving resistor is conductive to the first driving signal port, the second terminal of the first driving resistor is conductive to the gate of the IGBT, and the first MOS transistor, the second driving resistor and the third anti-reverse diode are connected in series and then connected to the first driving resistor in parallel;

wherein the first gate of the first MOS transistor is connected to the second source of the second MOS transistor.

In some embodiments, the resistor adjustment control circuit further includes:

a fifth protection resistor connected between the driving resistor adjustment circuit and the second gate;

a sixth protection resistor connected between the second gate and the collector of the NPN-type triode; and/or a seventh protection resistor, wherein one terminal of the seventh protection resistor is connected between the second anti-reverse diode and the freewheel capacitor, and the other terminal of the seventh protection resistor is connected between the second gate and the collector of the NPN-type triode.

According to a second aspect of the present disclosure, there is provided a power conversion device, including the IGBT driving circuit according to the above embodiments.

BRIEF DESCRIPTION OF THE DRAWINGS

The drawings illustrated here are intended to provide a further understanding of the present disclosure and form a part of the present application. The illustrative embodiments of the present disclosure and their descriptions are intended to explain the present disclosure, without limiting the present disclosure improperly. In the accompanying drawings.

DESCRIPTION OF THE INVENTION

The present disclosure is explained in detail below. In the following paragraphs, different aspects of the embodiments are defined in more detail. Such defined aspects may be combined with any other aspect or aspects, unless it is explicitly stated that they cannot be combined. In particular, any feature that is considered preferable or advantageous may be combined with one or more other features that are considered preferable or advantageous.

Embodiments of the present disclosure provide an IGBT driving circuit and a power conversion device, which can prevent the IGBT driving circuit from being electrically conducted during a turn-off period.

In the IGBT driving circuit according to the embodiments of the present disclosure, when the IGBT is turned off, whether there is a peak voltage is monitored by the peak voltage detection circuit 30, so as to select a resistance value of the driving resistor reduced relative to a normal working state. When there is a peak voltage, an additional rapid discharge channel is provided for accumulated charge of the gate of the IGBT by reducing the driving resistor during the turn-off, so as to suppress the peak voltage of the gate, ensure that the IGBT is not electrically conducted by mistake, and realize a function of protecting the IGBT during the turn-off.

Figure 1:
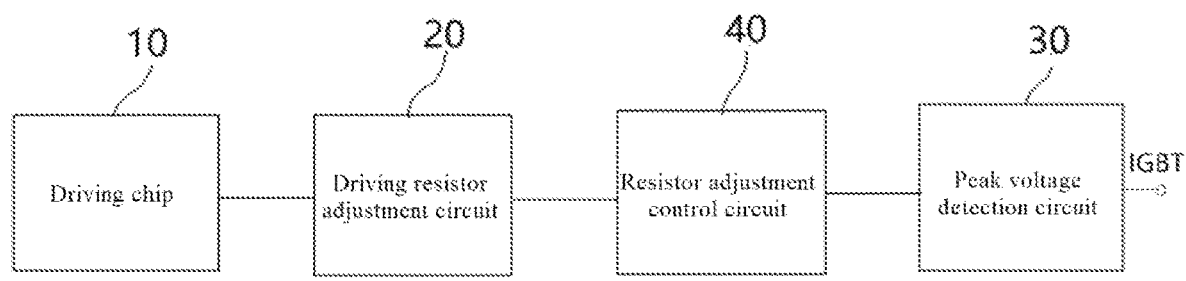
FIG. 1 is a composition schematic diagram of modules of some embodiments of an IGBT driving circuit according to the present disclosure.
Figure 2:
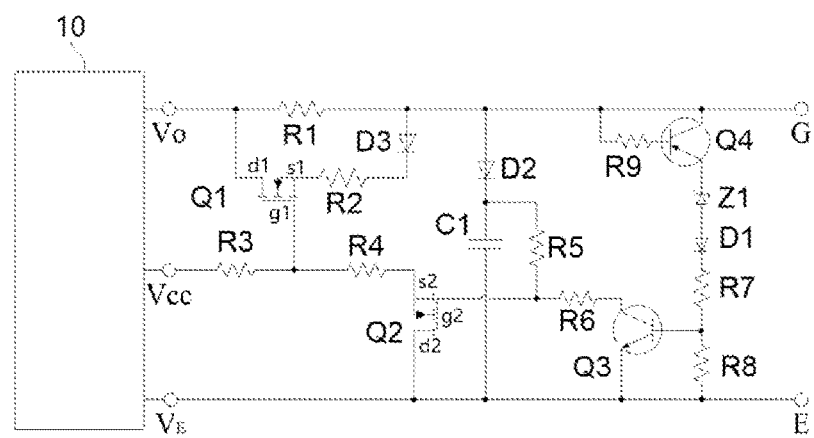
FIG. 2 is a circuit schematic diagram of some embodiments of the IGBT driving circuit according to the present disclosure.

As shown in FIG. 1 and FIG. 2, the present disclosure provides an IGBT driving circuit, including a driving chip 10, a driving resistor adjustment circuit 20, a peak voltage detection circuit 30 and a resistor adjustment control circuit 40.

The driving chip 10 has a first driving signal port Vo, a second driving signal port $V_E$, and a forward bias voltage output port Vcc. The first driving signal port Vo is conductive to a gate G of the IGBT, and the second driving signal port $V_E$ is conductive to an emitter E of the IGBT. The first driving signal port Vo and the second driving signal port $V_E$ are used for outputting driving signals, and the forward bias voltage output port Vcc is used for outputting a forward voltage.

The driving resistor adjustment circuit 20 is connected between the first driving signal port Vo and the gate G of the IGBT, and a driving resistor formed by the driving resistor adjustment circuit 20 is adjustable in size.

The peak voltage detection circuit 30 is connected to the gate G of the IGBT conductive to the first driving signal port Vo, and the peak voltage detection circuit 30 is configured to monitor whether a peak voltage occurs when the IGBT is turned off.

The resistor adjustment control circuit 40 is connected between the peak voltage detection circuit 30 and the driving resistor adjustment circuit 20 and is configured to reduce the resistor formed by the driving resistor adjustment circuit 20 when the peak voltage is monitored when the IGBT is turned off.

In the IGBT driving circuit according to the embodiment of the present disclosure, when the IGBT is turned off, whether there is a peak voltage is monitored by the peak voltage detection circuit 30, so as to select a resistance value of the driving resistor which is reduced relative to a normal working state. When there is a peak voltage, an additional rapid discharge channel is provided for accumulated charge of the gate of the IGBT by reducing the driving resistor during the turn-off, so as to suppress the peak voltage of the gate, ensure that the IGBT is not electrically conducted by mistake, and realize the function of protecting the IGBT during the turn-off.

"Electrically conducted by mistake" means that two IGBTs of the same bridge arm connected to the anode and the cathode of a bus are electrically conducted at the same time, which is equivalent to short-circuiting of the anode and the cathode of the bus, and a large amount of current will pass through the IGBTs to cause short-circuit damages. Then, a power conversion device will stop working to prevent electrical conduction by mistake, thereby preventing the IGBTs from being damaged by the short circuit and ensure normal operation of the device.

In some embodiments, as shown in FIG. 2, the driving resistor adjustment circuit 20 includes a first driving resistor R1, a first MOS transistor Q1, a second driving resistor R2, and a third anti-reverse diode D3. The first driving resistor R1 and the second driving resistor R2 are used for driving the IGBT to be turned on and off and control a current size.

A first terminal of the first driving resistor R1 is conductive to the first driving signal port Vo, a second terminal of the first driving resistor R1 is conductive to the gate G of the IGBT, and the first MOS transistor Q1, the second driving resistor R2 and the third anti-reverse diode D3 are connected in series and then connected to the first driving resistor R1 in parallel. An anode of the third anti-reverse diode D3 is connected to the first driving resistor R1, and a cathode of the third anti-reverse diode D3 is connected to the second driving resistor R2. The MOS transistor is an insulated gate field effect transistor ("metal oxide semiconductor").

In the present embodiment, when the IGBT is turned off, if a voltage of the gate G of the IGBT is normal, a first gate g1 of the first MOS transistor Q1 is turned off by the resistor adjustment control circuit 40, so that the driving resistor is the first driving resistor R1; if the peak voltage is monitored by the peak voltage detection circuit 30, the first MOS transistor Q1 is turned on by the resistor adjustment control circuit 40, so that the driving resistor is the resistor formed by connecting the first driving resistor R1 and the second driving resistor R2 in parallel, and the resistance after parallel connection is smaller than the resistance of R1. Therefore, the additional rapid discharge channel can be provided for the accumulated charge of the gate G of the IGBT, thereby suppressing the peak voltage of the gate, ensuring that the IGBT is not electrically conducted by mistake, and realizing the function of protecting the IGBT during the turned-off.

In some embodiments, as shown in FIG. 2, the driving chip 10 has the forward bias voltage output port Vcc, and the first gate g1 of the first MOS transistor Q1 is connected to the forward bias voltage output port Vcc and the resistor adjustment control circuit 40.

The resistor adjustment control circuit 40 is configured to ground and turn off the first gate g1 of the first MOS transistor Q1 when the voltage is normal after the IGBT is turned off, so that the driving resistor is the first driving resistor R1; when the peak voltage is monitored, the voltage at a connection position between the first gate g1 of the first MOS transistor Q1 and the resistor adjustment control circuit 40 is lower than the voltage of the forward bias voltage output port Vcc, to turn on the first MOS transistor Q1, so that the driving resistor is the resistor formed by connecting the first driving resistor R1 and the second driving resistor R2 in parallel.

In the present embodiment, the voltage applied to the first gate g1 of the first MOS transistor Q1 can be controlled by the resistor adjustment control circuit 40 to control the on and off of the first MOS transistor Q1. Therefore, when there is a peak voltage after the IGBT is turned off, the first MOS transistor Q1 is turned on, so that the driving resistor is the resistor formed by connecting the first driving resistor R1 and the second driving resistor R2 in parallel, and the driving resistor is reduced compared with a normal voltage of the gate G of the IGBT. Therefore, the additional rapid discharge channel can be provided for the accumulated charge of the gate G of the IGBT, thereby suppressing the peak voltage of the gate, ensuring that the IGBT is not electrically conducted by mistake, and realizing the function of protecting the IGBT during the turn-off.

In some embodiments, the driving chip 10 has the forward bias voltage output port Vcc, and the first gate g1 of the first MOS transistor Q1 is connected to the forward bias voltage output port Vcc through a first protection resistor R3. In the present embodiment, a function of current limiting can be achieved when the first gate g1 of the first MOS transistor Q1 is grounded, so as to prevent an excessively large voltage applied by the forward bias voltage output port Vcc to the first MOS transistor Q1, thereby avoiding damages to the driving chip 10 or the first MOS transistor Q1.

In some embodiments, as shown in FIG. 2, the peak voltage detection circuit 30 includes a PNP-type triode Q4, a breakdown diode Z1, a first anti-reverse diode D1, a second protection resistor R7 and a third protection resistor R9. If the voltage of the gate G of the IGBT exceeds a turn-on threshold of the IGBT, the breakdown diode Z1 is electrically conducted; the first anti-reverse diode D1 is configured to only allow the accumulated charge of the gate G of the IGBT to be released to the outside, and prevent the charge from flowing backward toward the gate G of the IGBT. An anode of the first anti-reverse diode D1 is connected to the breakdown diode Z1, and a cathode of the first anti-reverse diode D1 is connected to the second protection resistor R7. The second protection resistor R7 can prevent the gate G and the emitter E of the IGBT from being short-circuited; the third protection resistor R9 is used for preventing the excessively large voltage of the gate G of the IGBT from damaging the PNP-type triode Q4.

The breakdown diode Z1, the first anti-reverse diode D1 and the second protection resistor R7 are sequentially connected in series, and the second protection resistor R7 is connected to the resistor adjustment control circuit 40 and the emitter E of the IGBT. An emitter of the PNP-type triode Q4 is connected to the breakdown diode Z1, a collector of the PNP-type triode Q4 is directly connected to the gate G of the IGBT, and a base of the PNP-type triode Q4 is connected to the gate G of the IGBT through the third protection resistor R9.

In the present embodiment, by disposing the breakdown diode Z1 in the peak voltage detection circuit 30, reliable detection can be realized when there is a peak voltage after the IGBT is turned off, so as to reduce the driving resistor in time and release the excessive charge.

In some embodiments, as shown in FIG. 2, the driving chip 10 has the second driving signal port $V_E$ conductive to the emitter E of the IGBT, and a connection position between the peak voltage detection circuit 30 and the resistor adjustment control circuit 40 is connected to the second driving signal port $V_E$ through a fourth protection resistor R8. By disposing the fourth protection resistor R8, the peak voltage detection circuit 30 and the resistor adjustment control circuit 40 can be protected, especially the NPN-type triode Q3 in the adjustment control circuit 40 is prevented from being damaged by the excessively large voltage. Furthermore, the fourth protection resistor R8 can prevent the gate G and the emitter E of the IGBT from being short-circuited.

In some embodiments, as shown in FIG. 2, the driving chip 10 has the second driving signal port $V_E$ conductive to the emitter E of the IGBT, and the resistor adjustment control circuit 40 includes a second anti-reverse diode D2 and a freewheel capacitor C1 connected in series, a second MOS transistor Q2 and an NPN-type triode Q3.

An anode of the second anti-reverse diode D2 is connected to a circuit where the first driving signal port Vo is connected to the gate G of the IGBT, and a connection point is located between the driving resistor adjustment circuit 20 and the peak voltage detection circuit 30. One terminal of the freewheel capacitor C1 away from the second anti-reverse diode D2 is connected to the second driving signal port $V_E$.

A second source s2 of the second MOS transistor Q2 is connected to the driving resistor adjustment circuit 20, specifically, the second source s2 is connected to the first gate g1 of the first MOS transistor Q1; a second drain d2 of the second MOS transistor Q2 is connected to the second driving signal port $V_E$, and a second gate g2 of the second MOS transistor Q2 is connected between the second anti-reverse diode D2 and the freewheel capacitor C1.

A collector of the NPN-type triode Q3 is connected to the second gate g2, an emitter of the NPN-type triode Q3 is connected to the second driving signal port $V_E$, and a base of the NPN-type triode Q3 is connected to one terminal of the peak voltage detection circuit 30 connected to the emitter E of the IGBT.

According to the present embodiment, when the peak voltage detection circuit 30 detects the peak voltage, the voltage at the connection position between the first gate g1 of the first MOS transistor Q1 and the resistor adjustment control circuit 40 can be adjusted through cooperation of various components, so as to control the on and off of the first MOS transistor Q1. Therefore, different driving resistors can be adopted in the case of the normal voltage and the peak voltage after the IGBT is turned off, to ensure reliable operation of the IGBT driving circuit.

In some embodiments, the driving resistor adjustment circuit 20 includes the first driving resistor R1, the first MOS transistor Q1, the second driving resistor R2 and the third anti-reverse diode D3; the first terminal of the first driving resistor R1 is conductive to the first driving signal port Vo, the second terminal of the first driving resistor R1 is conductive to the gate G of the IGBT, and the first MOS transistor Q1, the second driving resistor R2 and the third anti-reverse diode D3 are connected in series and then connected to the first driving resistor R1 in parallel. The first gate g1 of the first MOS transistor Q1 is connected to the second source s2 of the second MOS transistor Q2.

In some embodiments, as shown in FIG. 2, the resistor adjustment control circuit 40 further includes:
a fifth protection resistor R4 connected between the driving resistor adjustment circuit 20 and the second gate g2;
a sixth protection resistor R6 connected between the second gate g2 and the collector of the NPN-type triode Q3; and/or
a seventh protection resistor R5, one terminal of the seventh protection resistor R5 being connected between the second anti-reverse diode D2 and the freewheel capacitor C1, and the other terminal of the seventh protection resistor R5 being connected between the second gate g2 and the collector of the NPN-type triode Q3.

In the present embodiment, both the fifth protection resistor R4 and the first protection resistor R3 can play a role of current limiting protection when the second MOS transistor Q2 is electrically conducted and the gate g1 of the first MOS transistor Q1 is grounded, to prevent the first MOS transistor Q1, the second MOS transistor Q2 or the driving chip 10 from being damaged by an excessively large current. Both the seventh protection resistor R5 and the sixth protection resistor R6 can play a role of current limiting protection after the second gate g2 of the second MOS transistor Q2 is connected to one terminal of the freewheel capacitor C1 or grounded through the NPN-type triode Q3.

Next, the specific structure of the IGBT driving circuit according to the present disclosure will be explained in combination with FIG. 2.

The driving chip 10 has the first driving signal port Vo, the second driving signal port $V_E$ and the forward bias voltage output port Vcc, and the IGBT has the gate G and the emitter E. The first driving signal port Vo is connected to the gate G of the IGBT, and the second driving signal port $V_E$ is connected to the emitter E of the IGBT.

The used devices include the first driving resistor R1, the second driving resistor R2, the breakdown diode Z1, the first anti-reverse diode D1, the second anti-reverse diode D2, the third anti-reverse diode D3, the freewheel capacitor C1, the protection resistor R3, the protection resistor R4, the protection resistor R5, the protection resistor R6, the protection resistor R7, the protection resistor R8, the protection resistor R9, the N-type first MOS transistor Q1, the N-type second MOS transistor Q2, the NPN-type triode Q3 and the PNP-type triode Q4.

As shown in FIG. 2, the first driving resistor R1 is disposed between the first driving signal port Vo and the gate G of the IGBT, and the second driving resistor R2, the N-type first MOS transistor Q1 and the third anti-reverse diode D3 are connected in series and then connected to both terminals of the first driving resistor R1 in parallel.

A first drain d1 of the first MOS transistor Q1 and one terminal of the first driving resistor R1 are connected to the first driving signal port Vo, and a first source s1 of the first MOS transistor Q1 is connected to the second driving resistor R2. The first gate g1 of the first MOS transistor Q1 is connected to the forward bias voltage output port Vcc, the first gate g1 of the first MOS transistor Q1 is connected to the second source s2 of the N-type second MOS transistor Q2 through the fifth protection resistor R4, and the second drain d2 of the second MOS transistor Q2 is connected to the second driving signal port $V_E$. The second gate g2 of the second MOS transistor Q2 is connected between the freewheel capacitor C1 and the second anti-reverse diode D2 through the seventh protection resistor R5, and the anode of the second anti-reverse diode D2 is connected between the first driving signal port Vo and the second driving signal port $V_E$, and is located between the third anti-reverse diode D3 and the connection point between the collector of the PNP-type triode Q4 and the gate G of the IGBT. One terminal of the freewheel capacitor C1 away from the second anti-reverse diode D2 is connected to the second driving signal port $V_E$.

The collector of the NPN-type triode Q3 is connected between the sixth protection resistor R6 and the second gate g2 of the second MOS transistor Q2, and one terminal of the seventh protection resistor R5 is connected between the second gate g2 and the sixth protection resistor R6. The emitter of the NPN-type triode Q3 is connected to a communication circuit between the second driving signal port $V_E$ and the emitter E of the IGBT, and is located between the freewheel capacitor C1 and the connection point between the fourth protection resistor R8 and the communication circuit. The base of the NPN-type triode Q3 is connected to the emitter of the PNP-type triode Q4 after the second protection resistor R7, the first anti-reverse diode D1 and the breakdown diode Z1 are sequentially connected in series. The collector of the PNP-type triode Q4 is directly conductive to the gate G of the IGBT, and the base of the PNP-type triode Q4 is connected to the gate G of the IGBT through the third protection resistor R9, so that the voltage of the gate G can be monitored in real time when the IGBT is turned off.

The working principle of such IGBT driving circuit is as follows:

1. The voltage of the gate G of the IGBT is normal.

When the first driving signal port Vo outputs a turn-on signal Von, the PNP-type triode Q4 does not work, so that the NPN-type triode Q3 is not electrically conducted, the second anti-reverse diode D2 is electrically conducted, and the freewheel capacitor C1 is charged. At the same time, the voltage is applied to the second MOS transistor Q2 through the seventh protection resistor R5, so that the second MOS transistor Q2 is electrically conducted, which lowers a front potential of the fifth protection resistor R4, the voltage of the first gate g1 of the first MOS transistor Q1 is grounded and turned off, and at this time, the resistance value of the driving resistor is the resistance value of R.

When Vo outputs a turn-off signal −Voff, the PNP-type triode Q4 is electrically conducted and starts to work. Since the voltage of the gate G of the IGBT is normal, the breakdown diode Z1 is not broken, and the NPN-type triode Q3 is still not electrically conducted. At this time, the second anti-reverse diode D2 does not work, and the freewheel capacitor C1 applies a voltage to turn on the second MOS transistor Q2, and the voltage of the first gate g1 of the first MOS transistor Q1 is grounded and turned off. At this time, the resistance value of the driving resistor is the resistance value of R1.

2. When the IGBT is turned off, the gate has the peak voltage.

When the first driving signal port Vo outputs the negative voltage turn-off signal −Voff and the gate has the peak voltage, if the peak voltage exceeds the turn-on threshold of the IGBT, the breakdown diode Z1 is broken, the first anti-reverse diode D1 and the NPN triode Q3 start to work, and a front potential of the sixth protection resistor R6 is lowered, so that the voltage of the second gate g2 of the second MOS transistor Q2 is grounded and turned off. Therefore, the forward bias voltage output port Vcc continuously applies a forward bias voltage to the first MOS transistor Q1, so that the first MOS transistor Q1 is electrically conducted, and the second driving resistor R2 is connected to the circuit and connected to R1 in parallel. At this time, the resistance value of the driving resistor is R1·R2/(R1+R2), and the value of the driving resistor becomes smaller. At this time, the charge of the gate G of the IGBT is rapidly discharged through the low-impedance driving circuit, and the voltage peak is suppressed.

Secondly, the present disclosure also provides a power conversion device, including the IGBT driving circuit according to the above embodiments. The conversion of direct current to alternating current by the power conversion device is an inversion process, and the conversion of alternating current to direct current is a rectification process. These two processes are both realized by alternatively turning on and off several IGBTs, that is, the IGBTs are always turned on and off in any working state.

Therefore, by adopting the IGBT driving circuit according to the present disclosure, when the IGBT is turned off, when there is a peak voltage, the additional rapid discharge channel is provided for the accumulated charge of the gate of the IGBT by reducing the driving resistor during the turn-off, thereby suppressing the peak voltage of the gate, ensuring that the IGBT is not electrically conducted by mistake, realizing the function of protecting the IGBT during the turn-off, preventing the IGBT from being damaged by the short circuit, and thus ensuring normal operation of the power conversion device.

It should also be noted that the functional blocks, components, systems, devices or circuits described herein may be implemented by using hardware, software or a combination of the hardware and software. For example, the disclosed embodiments may be implemented by using one or more integrated circuits, and the one or more integrated circuits are programmed to perform the functions, tasks, methods, actions or other operational features described herein for the disclosed embodiments. The one or more integrated circuits may include, for example, one or more processors or Configurable Logic Devices (CLD), or a combination thereof. The one or more processors may be, for example, one or more Central Processing Units (CPUs), controllers, microcontrollers, microprocessors, hardware accelerators, Application Specific Integrated Circuits (ASICs), or other integrated processing devices. The one or more CLDs may be, for example, one or more Complex Programmable Logic Devices (CPLDs), Field Programmable Gate Arrays (FPGAs), Programmable Logic Arrays (PLAs), reconfigurable logic circuits, or other integrated logic devices. In addition, the integrated circuit including one or more processors may be programmed to execute software, firmware, codes or other program instructions, the other program instructions are embodied in one or more non-transitory tangible computer-readable mediums to perform the functions, tasks, methods, actions, or other operational features described herein for the disclosed embodiments. The integrated circuit including one or more CLDs may also be programmed by using logic codes, logic definitions, hardware description languages, configuration files or other logic instructions, and the other logic instructions are embodied in one or more non-transitory tangible computer-readable mediums to perform the functions, tasks, methods, actions or other operational features described herein for the disclosed embodiments. In addition, the one or more non-transitory tangible computer-readable mediums may include, for example, one or more data storage devices, memory devices, flash memories, random access memories, read-only memories, programmable memory devices, reprogrammable storage devices, hard drives, floppy disks, DVDs, CD-ROMs, or any other non-transitory tangible computer-readable mediums. Other transformations may also be implemented while the techniques described herein are still used.

Unless otherwise stated, the terms such as "first" and "second" are used for freely distinguishing the elements described by such terms. Therefore, these terms are not necessarily intended to indicate the temporal priority or other priorities of such elements.

The above describes the IGBT driving circuit and the power conversion device according to the present disclosure in detail. The specific embodiments are used herein for explaining principles and implementations of the present disclosure, and the explanations of the above embodiments are only intended to help to understand the methods and core ideas of the present disclosure. It should be pointed out that for those ordinary skilled in the art, without departing from the principles of the present disclosure, several improvements and modifications may also be made to the present disclosure, and these improvements and modifications also fall within the scope of protection of claims of the present disclosure.

The invention claimed is:

1. An Insulated Gate Bipolar Transistor (IGBT) driving circuit, comprising:
   a driving chip having a first driving signal port (Vo);
   a driving resistor adjustment circuit, connected between the first driving signal port (Vo) and a gate (G) of an IGBT, a driving resistor formed by the driving resistor adjustment circuit being adjustable;
   a peak voltage detection circuit, connected to the gate (G) of the IGBT which is conductive to the first driving signal port (Vo), the peak voltage detection circuit being configured to monitor whether a peak voltage occurs when the IGBT is turned off; and
   a resistor adjustment control circuit, connected between the peak voltage detection circuit and the driving resistor adjustment circuit, and the resistor adjustment control circuit being configured to reduce a resistor formed by the driving resistor adjustment circuit when the peak voltage is monitored when the IGBT is turned off, wherein the driving chip has a second driving signal port ($V_E$) which is conductive to an emitter (E) of the IGBT, and a connection position between the peak voltage detection circuity and the resistor adjustment control circuit is connected to the second driving signal port ($V_E$) through a fourth protection resistor (R8).

2. The IGBT driving circuit according to claim 1, wherein the driving resistor adjustment circuit comprises a first driving resistor (R1), a first MOS transistor (Q1), a second driving resistor (R2) and a third anti-reverse diode (D3);

wherein a first terminal of the first driving resistor (R1) is conductive to the first driving signal port (Vo), a second terminal of the first driving resistor (R1) is conductive to the gate (G) of the IGBT, and the first MOS transistor (Q1), the second driving resistor (R2) and the third anti-reverse diode (D3) are electrically connected in series and then connected to the first driving resistor (R1) in parallel.

3. The IGBT driving circuit according to claim 2, wherein the driving chip has a forward bias voltage output port (Vcc), and a first gate (g1) of the first MOS transistor (Q1) is connected to the forward bias voltage output port (Vcc) and the resistor adjustment control circuit;

wherein the resistor adjustment control circuit is configured to ground and turn off the first gate (g1) of the first MOS transistor (Q1) when a voltage is normal after the IGBT is turned off, so that the driving resistor is the first driving resistor (R1); when the peak voltage is monitored, the voltage at a connection position between the first gate (g1) of the first MOS transistor (Q1) and the resistor adjustment control circuit is lower than the voltage of the forward bias voltage output port (Vcc), so that the first MOS transistor (Q1) is turned on and the driving resistor is a resistor formed by connecting the first driving resistor (R1) and the second driving resistor (R2) in parallel.

4. The IGBT driving circuit according to claim 2, wherein the driving chip has the forward bias voltage output port (Vcc), and the first gate (g1) of the first MOS transistor (Q1) is connected to the forward bias voltage output port (Vcc) through a first protection resistor (R3).

5. The IGBT driving circuit according to claim 1, wherein the peak voltage detection circuit comprises a PNP-type triode (Q4), a breakdown diode (Z1), a first anti-reverse diode (D1), a second protection resistor (R7) and a third protection resistor (R9);

wherein the breakdown diode (Z1), the first anti-reverse diode (D1) and the second protection resistor (R7) are sequentially connected in series, the second protection resistor (R7) is connected to the resistor adjustment control circuit, an emitter of the PNP-type triode (Q4) is connected to the breakdown diode (Z1), a collector of the PNP-type triode (Q4) is directly connected to the gate (G) of the IGBT, and a base of the PNP-type triode (Q4) is connected to the gate (G) of the IGBT through the third protection resistor (R9).

6. The IGBT driving circuit according to claim 1, wherein the driving chip has the second driving signal port ($V_E$) which is conductive to an emitter (E) of the IGBT, and the resistor adjustment control circuit comprises:

a second anti-reverse diode (D2) and a freewheel capacitor (C1) connected in series, wherein an anode of the second anti-reverse diode (D2) is connected to a circuit where the first driving signal port (Vo) is connected to the gate (G) of the IGBT, a connection point is located between the driving resistor adjustment circuit and the peak voltage detection circuit, and one terminal of the freewheel capacitor (C) is connected to the second driving signal port ($V_E$);

a second MOS transistor (Q2), wherein a second source (s2) of the second MOS transistor (Q2) is connected to the driving resistor adjustment circuit, a second drain (d2) of the second MOS transistor (Q2) is connected to the second driving signal port ($V_E$), and a second gate (g2) of the second MOS transistor (Q2) is connected between the second anti-reverse diode (D2) and the freewheel capacitor (C); and an NPN-type triode (Q3), wherein a collector of the NPN-type triode (Q3) is connected to the second gate (g2), an emitter of the NPN-type triode (Q3) is connected to the second driving signal port ($V_E$), and a base of the NPN-type triode (Q3) is connected to one terminal of the peak voltage detection circuit connected to the emitter (E) of the IGBT.

7. The IGBT driving circuit according to claim 6, wherein the driving resistor adjustment circuit comprises a first driving resistor (R1), a first MOS transistor (Q1), a second driving resistor (R2) and a third anti-reverse diode (D3); a first terminal of the first driving resistor (R1) is conductive to the first driving signal port (Vo), a second terminal of the first driving resistor (R1) is conductive to the gate (G) of the IGBT, and the first MOS transistor (Q1), the second driving resistor (R2) and the third anti-reverse diode (D3) are connected in series and then connected to the first driving resistor (R1) in parallel;

wherein the first gate (g1) of the first MOS transistor (Q1) is connected to the second source (s2) of the second MOS transistor (Q2).

8. The IGBT driving circuit according to claim 6, wherein the resistor adjustment control circuit further comprises:

a fifth protection resistor (R4), connected between the driving resistor adjustment circuit and the second gate (g2);

a sixth protection resistor (R6), connected between the second gate (g2) and the collector of the NPN-type triode (Q3); and/or a seventh protection resistor (R5), wherein one terminal of the seventh protection resistor (R5) is connected between the second anti-reverse diode (D2) and the freewheel capacitor (C), and the other terminal of the seventh protection resistor (R5) is connected between the second gate (g2) and the collector of the NPN-type triode (Q3).

9. A power conversion device, comprising the IGBT driving circuit according to claim 1.

* * * * *

UNITED STATES PATENT AND TRADEMARK OFFICE
CERTIFICATE OF CORRECTION

PATENT NO. : 12,047,058 B2  
APPLICATION NO. : 18/016392  
DATED : July 23, 2024  
INVENTOR(S) : Bo Yang et al.

Page 1 of 1

It is certified that error appears in the above-identified patent and that said Letters Patent is hereby corrected as shown below:

In the Claims

Column 11, Line 4, Claim 1, delete "circuity" and insert -- circuit --

Signed and Sealed this  
Twenty-fourth Day of June, 2025

Coke Morgan Stewart  
*Acting Director of the United States Patent and Trademark Office*